United States Patent [19]

Ema

[11] Patent Number: 5,148,246
[45] Date of Patent: Sep. 15, 1992

[54] CELL ARRAY OF A NON-VOLATILE SEMICONDUCTOR MEMORY DEVICES

[75] Inventor: Taiji Ema, Kawasaki, Japan

[73] Assignee: Fujitsu Limited, Kawasaki, Japan

[21] Appl. No.: 704,048

[22] Filed: May 22, 1991

[30] Foreign Application Priority Data

May 22, 1990 [JP] Japan .................. 2-131713

[51] Int. Cl.⁵ .............. H01L 29/68; H01L 27/10; H01L 27/15
[52] U.S. Cl. .................. 357/23.5; 357/45
[58] Field of Search .................. 357/23.5, 45

[56] References Cited

U.S. PATENT DOCUMENTS 4,839,705 6/1989 Tigelaar et al. .............. 357/23.5
4,935,791 6/1990 Namaki et al. .............. 357/23.5

FOREIGN PATENT DOCUMENTS 130975 10/1981 Japan .

Primary Examiner—Rolf Hille
Assistant Examiner—Robert Limanek
Attorney, Agent, or Firm—Staas & Halsey

[57] ABSTRACT

A cell array of non-volatile memory semiconductor memory device includes a semiconductor substrate having a first conduction type, a first insulating film formed on the semiconductor substrate, and a plurality of active regions formed in the semiconductor substrate, each of the active regions having a second conduction type opposite to the first conduction type. The cell array also includes a plurality of floating gate electrodes formed on the first insulating film, a second insulating film covering the floating gate electrodes, a plurality of control gate electrodes which are formed on the second insulating film and which run above the floating gate electrodes, and bit lines electrically coupled to the active regions. Each of the active regions has a substantially H-shaped surface portion close to adjacent four of the floating gate electrodes.

23 Claims, 8 Drawing Sheets

CELL ARRAY OF A NON-VOLATILE SEMICONDUCTOR MEMORY DEVICES

BACKGROUND OF THE INVENTION

The present invention generally relates to non-volatile semiconductor memory devices, and more particularly to a cell array of such devices wherein each device comprises an erasable and programmable read only memory device having a floating gate and a control gate.

Figure 1:
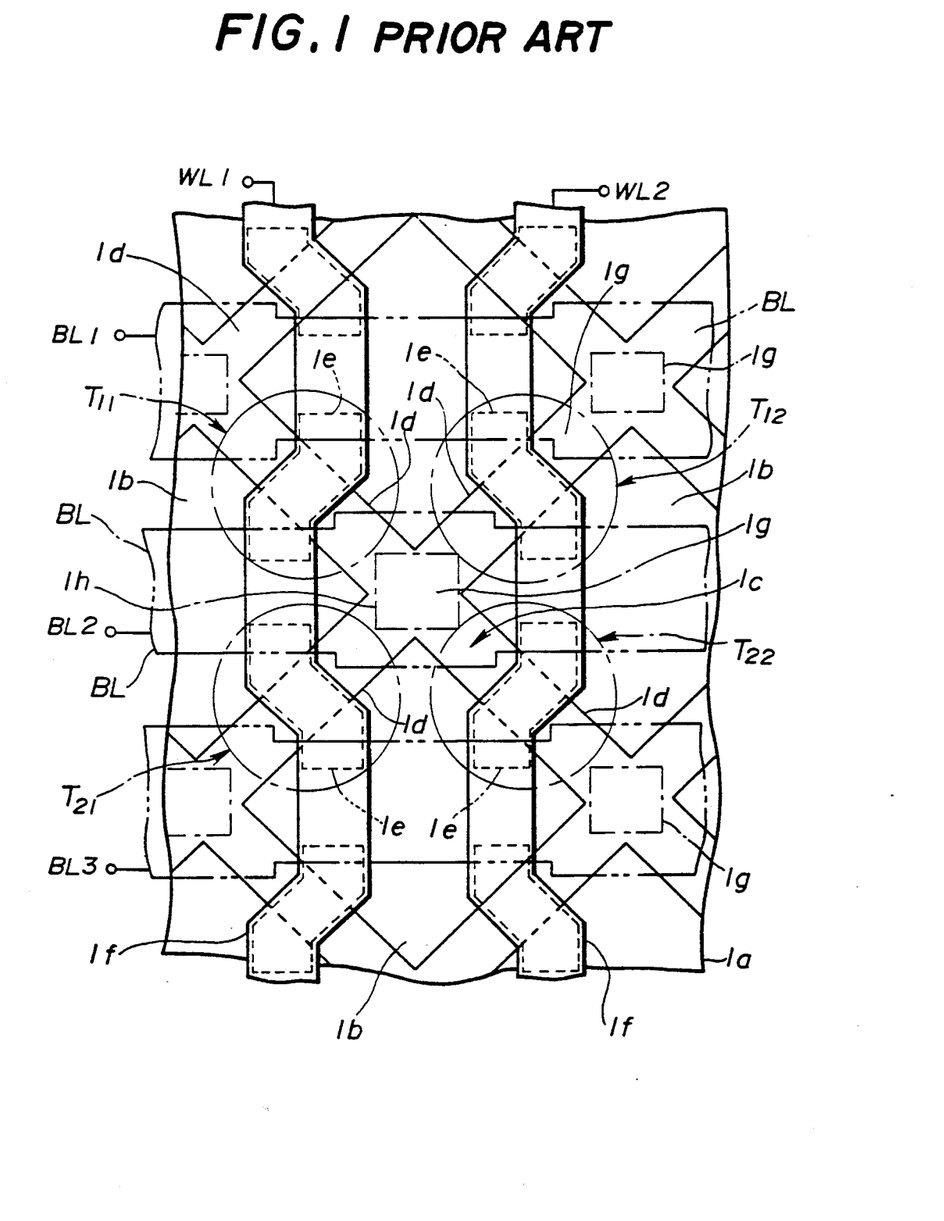
FIG. 1 is a plan view of a conventional array of EPROM cells.

FIG. 1 shows a conventional erasable and programmable read only memory (EPROM) disclosed in U.S. Pat. No. 4,893,705 or Japanese Laid-Open Patent Publication No. 56-130975 (which corresponds to U.S. patent application Ser. No. 88,789 filed on Oct. 29, 1979). Active regions of a plurality of EPROM cells T11, T12, T21 and T22 are electrically coupled through a bulk interconnection line. The EPROM cells T11, T12, T21 and T22 are arranged as follows. Selective oxide films (field insulation (oxidation) films) 1b having rectangular plans are formed on a top surface of a semiconductor substrate 1a and spaced apart from each other so that the field insulation films 1b are arranged in a matrix. Regions surrounded by the field insulation films 1b are arranged in a grid and serve as element formation regions 1c. Floating gate electrodes 1e are formed at a center part of belt-shaped portions 1d. An insulating film is formed on the entire surface including the floating gate electrodes 1e, and control gate electrodes 1f are formed on the insulating film so that the control gate electrodes 1f overlap with the floating gate electrodes 1e. Active regions 1g are formed on both sides of the gate electrodes 1e and 1f by a self-alignment process.

The active regions 1g are integrally formed in X-shaped regions of the element formation regions 1c so that the EPROM cells T11, T12, T21 and T22 are coupled. The control gate electrodes 1f are formed at an angle of about 45° with respect to the direction in which the belt-shaped portions 1d run, and arranged so that the control gate electrodes 1f run above the floating gate electrodes 1e. The floating gate electrodes 1e and the control gate electrodes 1f have belt-shaped portions so that they are orthogonal to the belt-shaped portions 1d.

An interlayer insulating film (not shown) is formed on the control gate electrodes 1f. Contact holes 1h are formed at positions of the interlayer insulating film which correspond to the center portions of the X-shaped portions of the active regions 1g. Bit lines BL, which are formed on the interlayer insulating film, are formed so that the bit lines BL are electrically in contact with the active regions 1g through the contact holes 1h.

Figure 2:
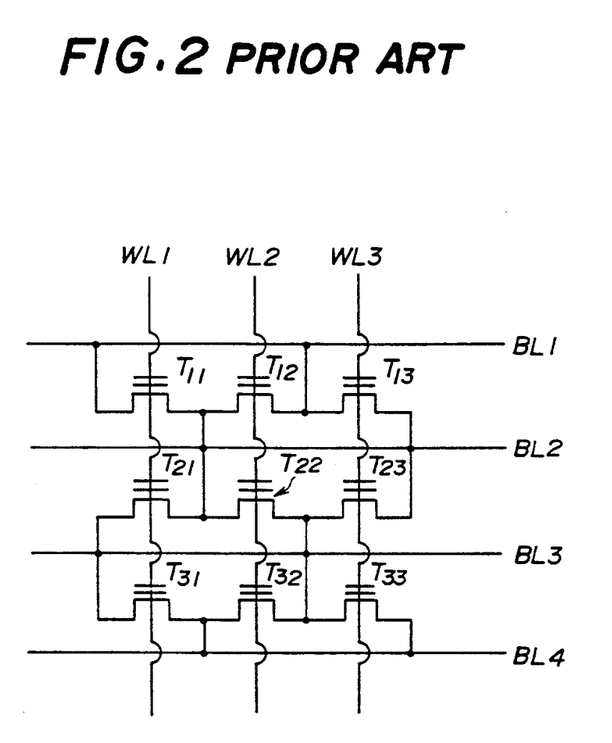
FIG. 2 is a circuit diagram of a conventional EPROM device having the array shown in FIG. 1.

A device including the EPROM cells T11, T12, T21 and T22 has an equivalent circuit shown in FIG. 2. For example, when the cell T22 is selected, a signal is applied to the control gate electrode 1f of the cell T22 via a word line WL2, and signals are applied to the two active regions 1g through bit lines BL2 and BL3.

Figure 3A:
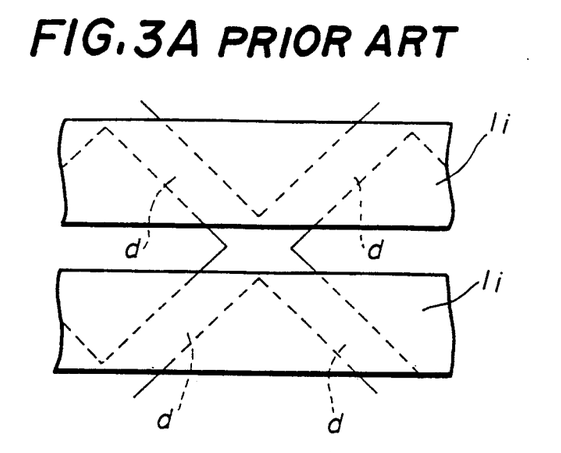
FIGS. 3A, 3B and 3C are diagrams illustrating a process of producing the array shown in FIG. 1.

The floating gate electrodes 1e and the control gate electrodes 1f are formed as follows. Referring to FIG. 3A, a first polysilicon film 1i provided for forming the floating gate electrodes 1e is formed on the entire surface. Next, the first polysilicon film 1i is patterned so that patterned portions run parallel to the bit lines BL, that is, the patterned portions are inclined at approximately 45° with respect to the long-side directions of the belt-shaped portions 1d in which the long-side edges thereof run.

Figure 3B:
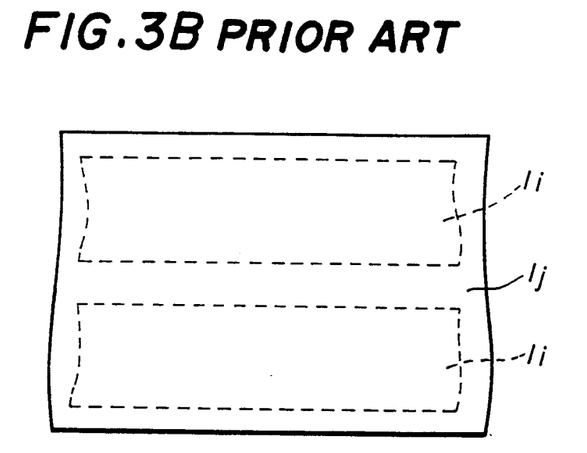
Figure 3C:
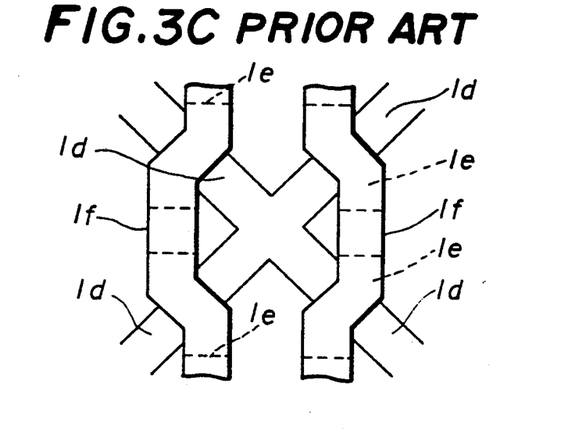

As shown in FIG. 3B, a second polysilicon film 1j, provided for forming the control gate electrodes 1f, is formed on the entire surface including the interlayer insulating film. After that, as shown in FIG. 3C, the first and second polysilicon films 1i and 1j are patterned. Thereby, the floating gate electrodes 1e and the control gate electrodes 1f are formed so that they have no positional error in the width direction thereof.

Figure 4A:
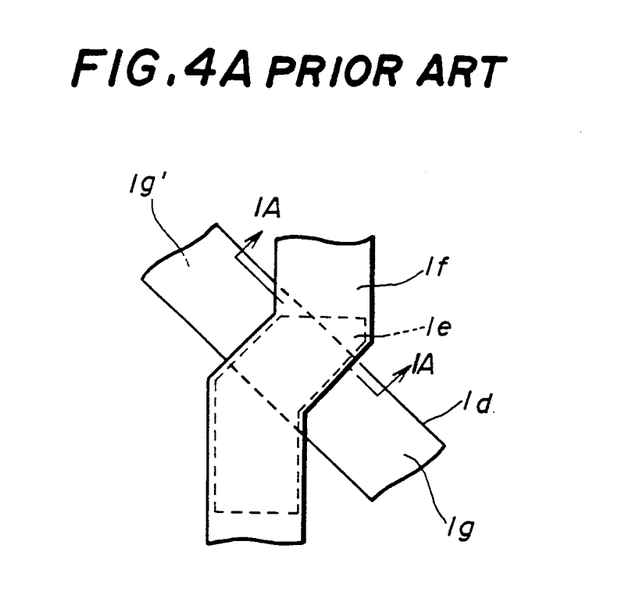
FIGS. 4A and 4B are diagrams illustrating a disadvantage of the conventional array shown in FIG. 1.
Figure 4B:
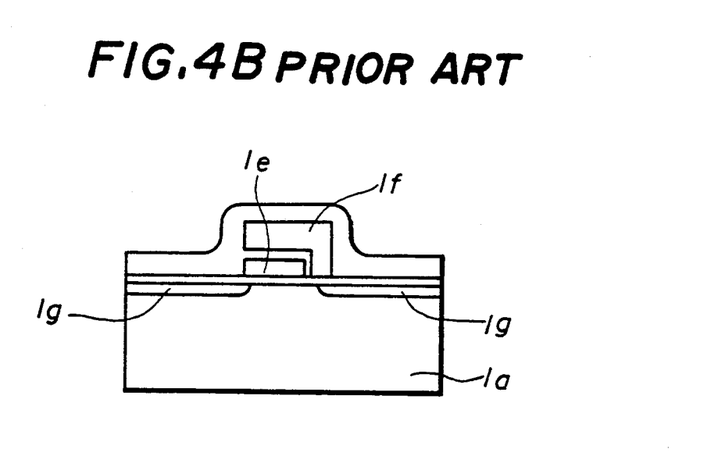

It should be noted that the ends of the floating gate electrodes 1e are close to the belt-shaped portions 1d of the element formation regions 1c. If a patterning error occurs during the step in which the first polysilicon film 1i is patterned, as shown in FIG. 4A, one of the two ends of the floating gate electrode 1e is positioned above the belt-shaped portion 1d and the floating gate electrode 1f is positioned above the belt-shaped portion 1d. Thus, as shown in FIG. 4B, the control gate electrode 1f has a portion which does not overlap with the floating gate electrode 1e.

As is well known, the threshold voltage of the EPROM cell transistor varies due to the existence/non-existence of a charge stored in the floating gate electrode 1e of the transistor. This variation in the threshold voltage is used for storing information. For example, when the floating gate electrode 1e is electrified so that it has a negative polarity, a channel is not formed in the semiconductor substrate 1a even if a predetermined voltage is applied to the control gate electrode 1f. Thus, no current passes between the active regions 1a located on both sides of the floating gate electrode 1e, so that the transistor is maintained in the OFF state. In this way, data is written into the EPROM cell.

On the other hand, when the floating gate electrode 1e is not electrified, the electric field caused by applying a voltage to the control gate electrode 1f is not reduced by the floating gate electrode 1e. Thus, a channel is formed under the floating gate electrode 1e, so that a current passes between the active regions 1g located on both sides of the floating gate electrode 1e. In this way, no data is written into the EPROM cell.

In the case where the control gate electrode 1f positionally deviates from the floating gate electrode 1d with respect to the belt-shaped portion 1d, the electric field formed by the control gate electrode 1f directly affects the semiconductor substrate 1a. The above-mentioned positional deviation of the floating gate electrode 1e forms a portion which cannot prevent the formation of the channel. This increases errors in readout data.

SUMMARY OF THE INVENTION

It is a general object of the present invention to provide an improved cell array of a non-volatile semiconductor memory device, in which the above-mentioned disadvantages are eliminated.

A more specific object of the present invention is to provide a cell array in which data can be definitely read even if a positional error, caused at the step where the floating gate electrodes are formed, occurs.

The above-mentioned objects of the present invention are achieved by a cell array of non-volatile memory semiconductor memory devices, comprising: a semiconductor substrate having a first conduction type; a first insulating film formed on the semiconductor substrate; a plurality of active regions formed in the semiconductor substrate, each of the active regions having a second conduction type opposite to the first conduction type; a plurality of floating gate electrodes formed on the first insulating film; a second insulating film covering the floating gate electrodes; a plurality of control gate electrodes which are formed on the second insulating film and which run above the floating gate electrodes; and bit lines electrically coupled to the active regions, each of the active regions having a substantially H-shaped surface portion close to four adjacent floating gate electrodes.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 5:
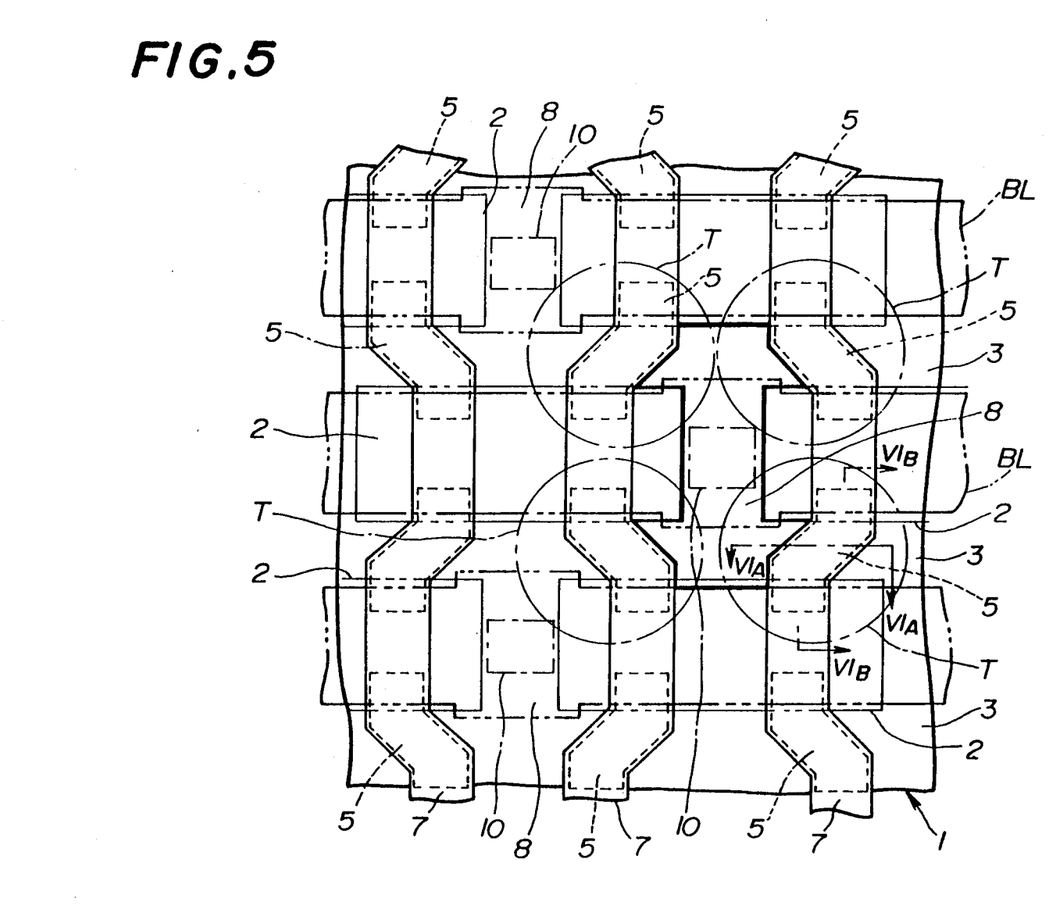
FIG. 5 is a plan view of an array of EPROM cells according to a first preferred embodiment of the present invention.

A description will now be given of a cell array according to a first preferred embodiment of the present invention with reference to FIGS. 5, 6A and 6B.

The cell array comprises a silicon semiconductor substrate 1 having a predetermined conduction type. A plurality of selective oxide films (field insulation films) 2 are formed on a top surface of the silicon substrate 1, and long-side edges of the field insulation films 2 run in an identical direction. The field insulation films 2 are spaced apart from each other at a definite distance and alternately arranged. Surrounded by the field insulation films 2 are element formation regions 3, on which thermal oxidation films 4 are formed.

Floating gate electrodes 5 are formed on the thermal oxidation films 4 on the element formation regions 3 and the floating gate electrodes 5 structurally interconnect the adjacent field insulation films 2. As shown in FIG. 6B, the opposite end portions of each of the floating gate electrodes 5 lie respective, two adjacent field insulation films 2. Each of the floating gate electrodes 5 has two opposite ends parallel to the direction in which the long-side edges of the field insulation films 2 run. In addition, the opposite ends of the floating gate electrodes 5, arranged in the direction in which the long-side edges of the field insulation films 2 run, are located on identical imaginary lines.

Figure 6A:
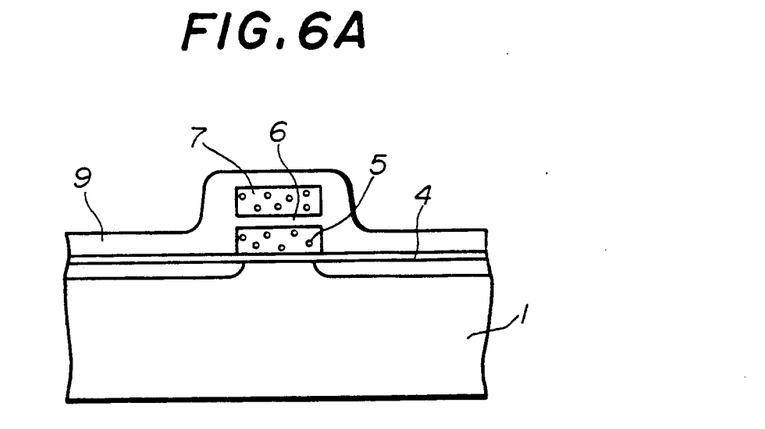
FIG. 6A is a cross-sectional view taken along line $VI_A$—$VI_A$ shown in FIG. 5.

As shown in FIG. 6A, an insulating film 6 formed of $SiO_2$ is formed on the floating gate electrodes 5. Control gate electrodes 7 are formed on the $SiO_2$ film 6. Each of the control gate electrodes 7 is arranged so that it crosses the long-side edges of the field insulation films 2 and runs above some of the floating gate electrodes 5. Each of the control gate electrodes 7 has a width which is substantially identical to that of each of the floating gate electrodes 5. The control gate electrodes 7 are made of, for example, doped polysilicon.

If the side-end portions of the floating gate electrodes 5 and the side-end portions of the control gate electrodes 7 are very close to the short-side edges of the field insulation films 2, abrupt step portions will be formed between the surface of the silicon substrate 1 and the control gate electrodes 7. In order to eliminate this problem, the floating gate electrodes 5 and the control gate electrodes 7 are positioned so that they are spaced apart from the short-side edges of the field insulation films 2 at a distance large enough to obtain smooth step portions (in other words, they are located at positions close to the center portions of the thermal oxidation films 4). The floating gate electrodes 5 and the control gate electrodes 7 are obliquely arranged at an angle of approximately 45° with respect to the long-side edges of the field insulation films 2 so that they obliquely cross the element formation regions 3.

Active regions 8, which have a conduction type opposite to that of the silicon substrate 1, are formed by a self-alignment process in which impurities are introduced into the element formation regions 3 on both sides of each of the floating gate electrodes 5. Each of the active regions 8 is integrally formed along the long-side and short-side edges of the field insulation films 2 and extends up to the side-end portions of the other floating gate electrodes 5. Each of the active regions 8 has a substantially H-shaped surface portion illustrated by a thick solid line shown in FIG. 5. Channel formation regions are formed in portions of the silicon substrate 1 which are located under the floating gate electrodes 5 and which are sandwiched between the neighboring active regions 8. An EPROM cell T is formed by the portion of the silicon substrate 1 in the element formation region 3, the floating gate electrode 5, the control gate electrode 7 and the respective active regions 8 located on the opposite sides of these electrodes.

Figure 6B:
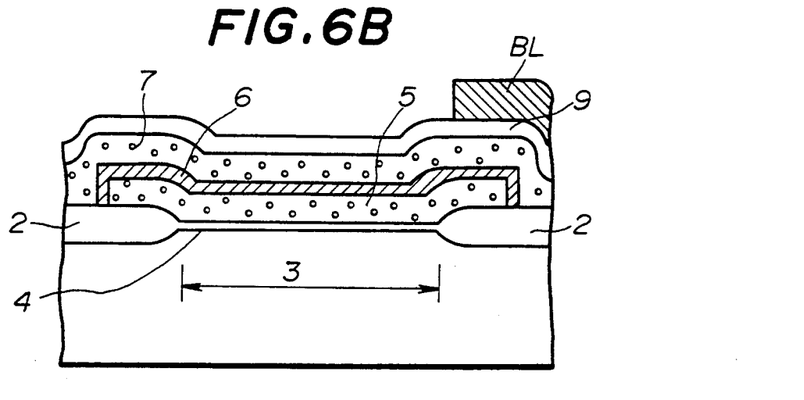
FIG. 6B is a cross-sectional view taken along line $VI_B$—$VI_B$ shown in FIG. 5.

As shown in FIG. 6B, an insulating film 9 formed of, for example, $SiO_2$, is formed on the entire surface. As shown in FIG. 5, contact holes 10, which are located at positions interposed between the short-side edges of the field insulation films 2, are formed in the $SiO_2$ film 9 and the thermal oxidation films 4. Bit lines BL are formed on the $SiO_2$ film 9 so that they run parallel to the long-side edges of the field insulation films 2. The bit lines BL are electrically in contact with the center portion of the H-shaped active regions 8 through the contact holes 10.

A description will now be given of the operation of the first embodiment of the present invention. Four EPROM cells T, which are coupled via the H-shaped active region 8, are electrically coupled to the bit line BL which runs over the above-mentioned H-shaped active region 8. The control gates 7 are coupled to the word lines WL. Thus, the first embodiment of the present invention has the same equivalent circuit as the conventional device shown in FIG. 2.

A voltage is applied to the control gate electrode 7 via the corresponding word line WL, and a voltage is applied across the active regions 8 via the neighboring two bit lines BL, so that a desired EPROM cell T is selected. When no charge is stored in the floating gate electrode 5 in the selected EPROM cell T, a channel is generated in the portion of the silicon substrate 1 under the floating gate electrode 5, so that the carrier is allowed to move. Thus, a current passes through the bit line BL, so that it can be recognized that no information is stored in the selected EPROM cell T. On the other hand, when a charge is stored in the floating gate electrode 5, no channel is generated and no current passes through the bit line BL, so that information has been written into the selected EPROM cell T.

Figure 7A:
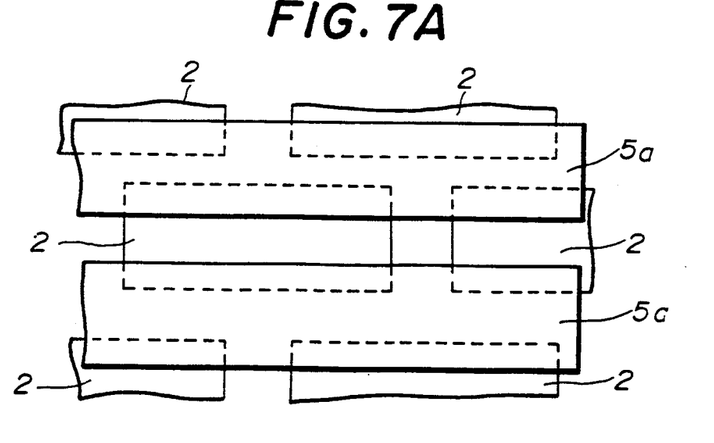
FIGS. 7A, 7B and 7C are diagrams showing a process of producing the array shown in FIG. 5.
Figure 7B:
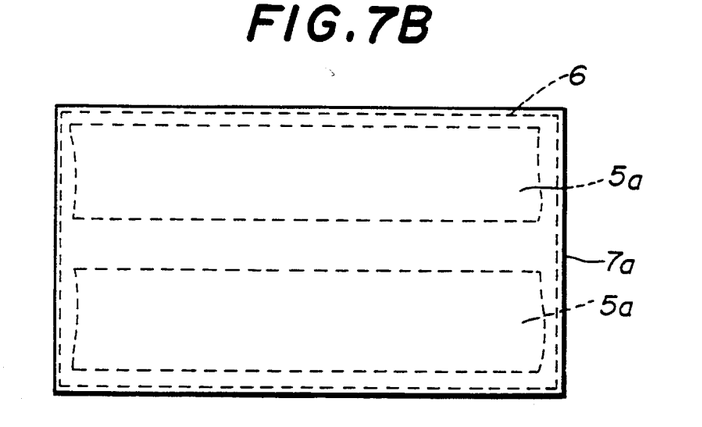
Figure 7C:
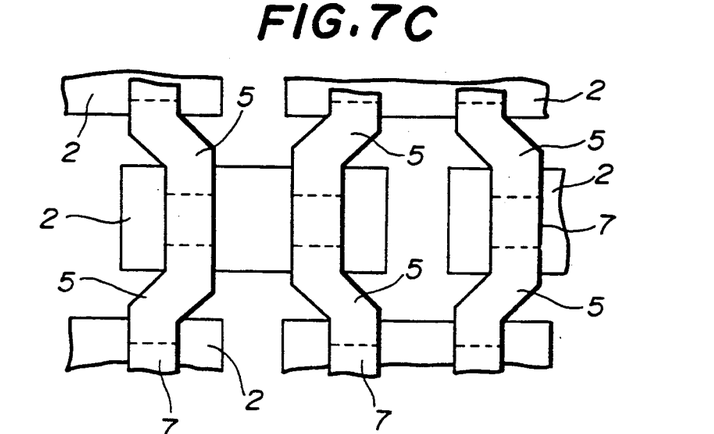

A description will now be given of a process of producing the first embodiment of the present invention. First, the field insulation films 2 formed of SiO₂ are formed to a thickness equal to, for example, 5000 angstroms by a LOCOS process. After the SiO₂ films 4 are formed to a thickness of about 200 angstroms by a thermal oxidation process, a polysilicon film for forming the floating gate electrodes 5 is deposited to a thickness of, for example, 1000 angstroms on the SiO₂ film 4 by a CVD process. POCl₃ is thermally diffused into the polysilicon film at 850° C. After that, as shown in FIG. 7A, the polysilicon film is patterned into films 5a running parallel to the long-side edges of the field insulation films 2 by a conventional photolithography technique and an RIE etching in which a gas of CCl₄/O₂ is used. Then, the SiO₂ film 6 is thermally formed to a thickness of, for example, 250 angstroms. Then, as shown in FIG. 7B, a polysilicon film 7a, used for forming the control gate electrodes 7, is deposited to a thickness equal to, for example, 2000 angstroms by a CVD process. POCl₃ is thermally diffused into the polysilicon film at 850° C. After that, the polysilicon films 5a and 7a are patterned into a belt shape at the same time, so that the floating gate electrodes 5 and the control gate electrodes 7 are defined. After that, the SiO₂ film 9 is formed to a thickness of, for example, 200 agnstroms on the surface of the control gate electrodes 7 by a thermal oxidation process. As⁺ ions are introduced at 4×10¹⁵/cm² at 70 keV, and an insulating film is formed by a CVD process. It is preferable to form a BPSG (boron phosphosilicate glass) film to a thickness of, for example, 5000 angstroms, on the entire surface. Then, the BPSG film is subjected to a reflow process in order to flatten the surface thereof. The contact holes 10 are formed in the BPSG film, the SiO₂ film 9, and the SiO₂ film 4 by the photolithography technique and RIE process in which a gas of CHF₃/He is used. After that, Al bit lines are formed.

Figure 8A:
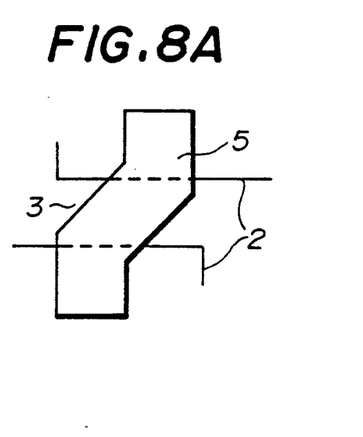
FIGS. 8A and 8B are diagrams showing an advantage of the first embodiment of the present invention shown in FIG. 5.
Figure 8B:
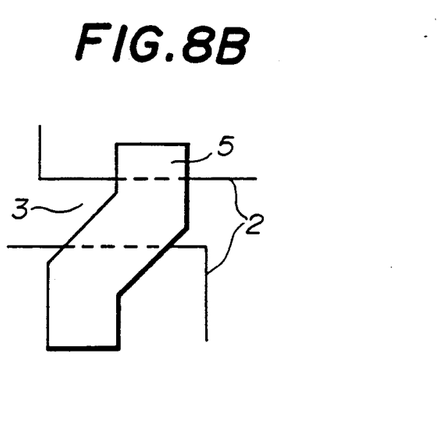

If a positional error occurs during the patterning process in which the polysilicon films 5a (FIG. 7B) are defined occurs, as shown in FIG. 8A or FIG. 8B, one of the ends of the floating gate electrode 5 does not enter the element formation region 3, and the floating gate electrode 5 and the control gate electrode 7 completely overlap with each other. It should be noted that the two opposite short-side ends of the floating gate electrodes 5 run substantially parallel to the long-side edges of the element formation regions 3. Since the floating gate electrode 5 and the control gate electrode 7 completely overlap with each other, all the electric field resulting from the control gate electrode 7 in the element formation region 3 is applied to the silicon substrate 1 through the floating gate electrode 5. On the other hand, when the charge is stored in the floating gate electrode 5, no channel is formed under the control gate electrode 7.

It should be noted that each field insulation film 2 has a substantially rectangular planar area in place of the square planar area of the prior art devices.

A description will now be given of a second preferred embodiment of the present invention with reference to FIGS. 9, 10A and 10B. In the aforementioned first embodiment, the floating gate electrodes 5 and the control gate electrodes 7 run on the thermal oxidation films 4 in the direction perpendicular to the direction in which the long-side edges of the thermal oxidation films 4 extend, and obliquely cross the element formation regions 3. Thus, the floating gate electrodes 5 and the control gate electrodes 7 have bent portions in the vicinity of the element formation regions 3. The adjacent control gate electrodes 17 are spaced apart from each other, alternately, at a maximum or a minimum distance at successive respective bent portions thereof.

Figure 9:
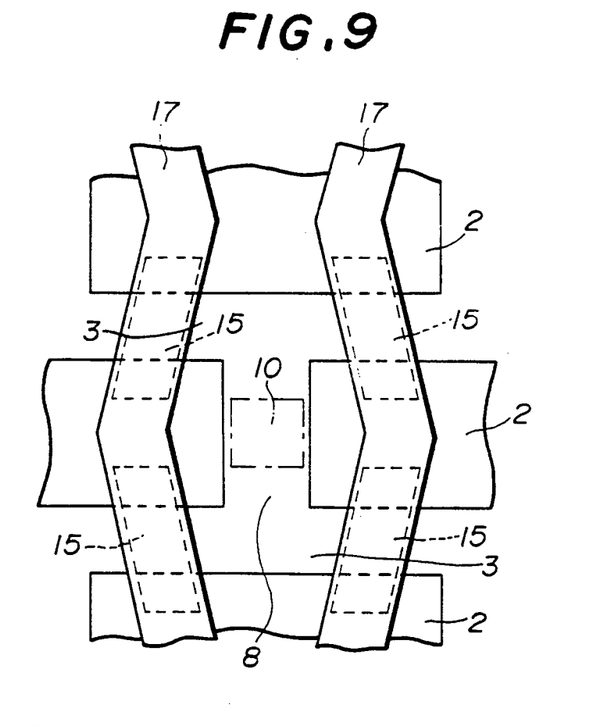
FIG. 9 is a plan view of an array according to a second preferred embodiment of the present invention.
Figures 10A, 10B:
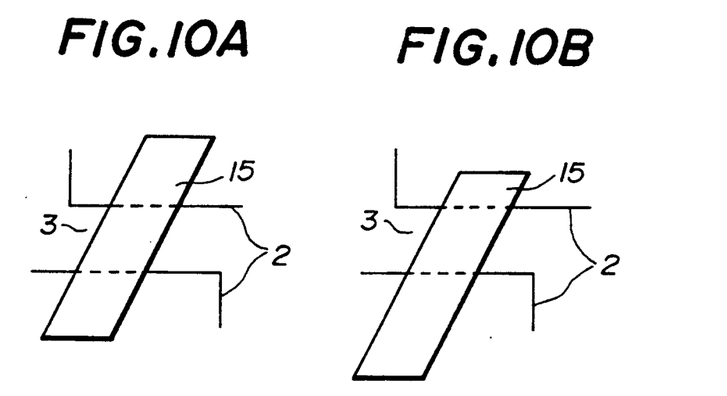
FIGS. 10A and 10B are diagrams showing an advantage of the array shown in FIG. 9.

On the other hand, as shown in FIG. 9, control gate electrodes 17 have alternate, "less-than" symbol, "greater-than" symbol-shaped surface portions on the field insulation films 2. Floating gate electrodes 15 beneath the control gate electrodes 17 have a substantially parallelogram planar surface shape. That is, the two opposite short-side ends of each of the floating gate electrodes 15 run in parallel to the long-side edges of the field insulation films 2, and the two opposite long-side ends thereof run parallel to each other. It should be noted that the area of each floating gate electrode 15 on the element formation region 3 does not change even if the floating gate electrode 15 has any positional error, as shown in FIG. 10A or 10B. Thus, the readout potential and write potential are not affected by such a positional error. That is, a potential $V_{FG}$ of the floating gate electrode 15 is defined as follows:

$$V_{FG} = K(V_{CF} + Q/C1)$$

where C1 is the coupling capacitance between the floating gate electrode 15 and the control gate electrode 7, C2 is the coupling capacitance between the floating gate electrode 15 and the semiconductor substrate 1, Q is a charge stored in the floating gate electrode 15, $V_{CF}$ is a voltage applied to the control gate electrode 17, and k is a coupling ratio defined as k=(C1/(C1+C2)). It can be seen from the above formula that if the coupling capacitance C1 and/or coupling capacitance C2 change, the potential $V_{FG}$ changes, so that the stability of data reading or writing is deteriorated. It will be noted that the arrangement according to the first embodiment of the present invention has a possibility that the coupling capacitance C2 changes due to a positional error of the floating gate electrode 5. The second embodiment does not have such a possibility.

The present invention is not limited to the specifically disclosed embodiments, and variations and modifications may be made without departing from the scope of the present invention.

What is claimed is:

1. A cell array of non-volatile memory semiconductor memory devices, comprising:
   a semiconductor substrate having a first conduction type;
   a first insulating film formed on said semiconductor substrate;
   a plurality of active regions formed in said semiconductor substrate, each of said active regions having a second conduction type opposite to said first conduction type;

a second insulating film formed on said active regions;

a plurality of floating gate electrodes formed on said second insulating film;

a third insulating film covering said floating gate electrodes;

a plurality of control gate electrodes formed on said third insulating film and which run above said floating gate electrodes;

each of said active regions having a substantially H-shaped planar surface configuration close to four respective and adjacent said floating gate electrodes, each said H-shaped active region, the respective portions of the four adjacent floating and control gate electrodes at the four free ends of the H-shape thereof, and the respective portions of the further, four adjacent H-shaped active regions defining four adjacent and symmetrically disposed transistors;

a fourth insulating film covering said control gate electrodes; and plurality bit lines formed on the fourth insulating film, each bit line being electrically connected to corresponding predetermined said active regions at respective positions, each position being located symmetrically with respect to the four adjacent and symmetrically located transistors.

2. A cell array as claimed in claim 1, wherein:

said H-shaped surface configuration has two opposite ends running substantially parallel to each other; and each of said floating gate electrodes has two opposite ends which run substantially parallel to said two opposite ends of said H-shaped planar surface configuration.

3. A cell array as claimed in claim 1, wherein:

said first insulating film comprises plural field insulation film portions spaced apart from each other; and each of said floating gate electrodes comprises an intermediate portion and two opposite end portions, the latter formed on two adjacent said field insulation film portions.

4. A cell array as claimed in claim 1, wherein said first insulating film comprises plural field insulation film portions spaced apart from each other, adjacent said portions having corresponding, parallel and spaced opposite edges defining therebetwen element formation regions of the substrate, and wherein each of said floating gate electrodes comprises:

a first portion having a first end running substantially parallel to the direction in which the parallel and spaced opposite edges of said field insulation film portions run;

a second portion having a second end running substantially parallel to said direction; and a third portion, interconnecting said first portion and said second portion, and extending obliquely with respect to said direction.

5. A cell array as claimed in claim 1, wherein said first insulating film comprises plural field insulation film portions spaced apart from each other, adjacent said portions having corresponding, parallel and spaced opposite edges defining therebetween element formation regions of the substrate;

said respective portions of said adjacent four floating gate electrodes further comprise respective oblique portions which extend obliquely with respect to said corresponding, parallel and spaced opposite edges of said field insulation film portions; and said substantially H-shaped planar surface portion of each active region has edges defined by said respective oblique portions of said associated floating gate electrodes.

6. A cell array as claimed in claim 5, wherein said substantially H-shaped planar surface configuration has edges defined by the respective, parallel and spaced opposite edges of two adjacent field insulation film portions.

7. A cell array as claimed in claim 1, wherein:

said second and third insulating films have a contact hole extending therethrough and located at a substantially central position of said substantially H-shaped planar surface portion; and each said H-shaped planar surface configuration active region is electrically connected through the associated contact hole with a respective, predetermined bit line.

8. A cell array as claimed in claim 1, wherein each of said floating gate electrodes has a substantial parallelogram planar surface configuration.

9. A cell array as claimed in claim 1, wherein:

said first insulating film comprises plural field insulation film portions spaced apart from each other; and each of said field insulation film portions has a substantially rectangular planar surface configuration.

10. A cell array as claimed in claim 1, wherein:

said first insulating film comprises plural field insulation film portions spaced apart from each other; and each of said field insulation film portions has a substantially square planar surface configuration.

11. A cell array as claimed in claim 1, wherein:

said first insulating film comprises plural field insulation film portions spaced apart from each other; and said substantially H-shaped surface configuration of each of said active regions has two opposite ends which run parallel to respective, parallel and spaced opposite edges of said corresponding field insulation film portions.

12. A cell array as claimed in claim 11, wherein said predetermined opposite edges of said field insulation film portions run in the common direction in which said bit lines run.

13. A cell array as claimed in claim 4, wherein said third portion extends obliquely with respect to said direction at approximately 45°.

14. A cell array as claimed in claim 1, wherein said first insulating film comprises plural field insulation film portions, adjacent said portions being spaced apart from each other at a predetermined distance and successive said film portions being alternately arranged.

15. A cell array of non-volatile memory semiconductor memory devices, comprising:

a semiconductor substrate having a first conduction type;

a first insulating film formed on said semiconductor substrate and comprising plural first field insulation film portions spaced apart from each other and defining therebetween corresponding plural element formation regions of the substrate;

a plurality of active regions formed in said corresponding, plural element formation regions of said semiconductor substrate, each of said active regions having a second conduction type opposite to said first conduction type;

a second insulating film formed on said active regions;

a plurality of floating gate electrodes formed on said second insulating film, each of said floating gate electrodes comprising a first portion having a first end running substantially parallel to the direction in which predetermined opposite edges of said field insulation film portions run, a second portion having a second end running substantially parallel to said direction, and a third portion connecting said first portion and said second portion and extending obliquely with respect to said direction;

a third insulating film covering said floating gate electrodes;

a plurality of control gate electrodes formed on said third insulating film and disposed above said floating gate electrodes;

a fourth insulating film covering said control gate electrodes;

a plurality of bit lines formed on said fourth insulating film and electrically coupled to respective, predetermined said active regions; and each of said active regions having a substantially H-shaped planar surface configuration with the four free ends of the H-shape disposed close to four respective and adjacent said floating gate electrodes.

16. A cell array as claimed in claim 15, wherein said third portion extends obliquely with respect to said direction at approximately 45°.

17. A cell array of non-volatile memory semiconductor memory devices, comprising:

a semiconductor substrate having a first conduction type;

a first insulating film formed on said semiconductor substrate, said first insulating film comprising plural first field insulation film portions spaced apart form each other and defining therebetween corresponding, plural element formation regions of the substrate;

a plurality of active regions formed in said corresponding, plural element formation regions of said semiconductor substrate, each of said active regions having a second conduction type opposite to said first conduction type;

a second insulating film formed on said active regions;

a plurality of floating gate electrodes formed on said first insulating film;

a third insulating film covering said floating gate electrodes;

a plurality of control gate electrodes formed on said third insulating film and disposed above said floating gate electrodes;

a fourth insulating film covering said control gate electrodes;

a plurality of bit lines formed on said fourth insulating film and electrically coupled to respective, predetermined said active regions;

each of said active regions having a substantially H-shaped planar surface configuration with the four free ends of the H-shape disposed close to four respective and adjacent said floating gate electrodes;

said four adjacent floating gate electrodes comprising respective oblique portions which extend obliquely with respect to predetermined opposite edges of said field insulation film portions; and said substantially H-shaped surface portion has edges defined by said respective oblique portions.

18. A cell array as claimed in claim 17, wherein said substantially H-shaped surface portion of each said active portion has edges defined by the two corresponding, adjacent field insulation film portions.

19. A cell array of non-volatile memory semiconductor memory devices, comprising:

a semiconductor substrate having a first conduction type;

a first insulating film formed on said semiconductor substrate;

a plurality of active regions formed in said semiconductor substrate, each of said active regions having a second conduction type opposite to said first conduction type;

a second insulating film formed on said active regions;

a plurality of floating gate electrodes formed on said second insulating film;

a third insulating film covering said floating gate electrodes;

a plurality of control gate electrodes formed on said third insulating film and disposed above said floating gate electrodes;

a fourth insulating film covering said control gate electrodes;

a plurality of bit lines formed on said fourth insulating film and electrically coupled to respective, predetermined said active regions;

each of said active regions having a substantially H-shaped planar surface configuration with the four free ends of the H-shape disposed close to four respective and adjacent said floating gate electrodes;

said first and second insulating films having a plurality of contact holes extending therethrough respectively associated with said plurality of active regions, each said contact hole being located at a substantially central portion of said substantially H-shaped surface portion of the respective said active region; and each said H-shaped surface portion is electrically connected to a respective and predetermined said bit line.

20. A cell array of non-volatile memory semiconductor memory devices, comprising:

a semiconductor substrate having a first conduction type;

a first insulating film formed on said semiconductor substrate;

a plurality of active regions formed in said semiconductor substrate, each of said active regions having a second conduction type opposite to said first conduction type;

a second insulating film formed on said active regions;

a plurality of floating gate electrodes formed on said second insulating film;

a third insulating film covering said floating gate electrodes;

a plurality of control gate electrodes formed on said third insulating film and disposed above said floating gate electrodes;

a fourth insulating film covering said control gate electrodes;

a plurality of bit lines formed on said fourth insulating film and electrically coupled to respective, predetermined said active regions;

each of said active regions having a substantially H-shaped planar surface configuration with the four free ends of the H-shape disposed close to four respective and adjacent said floating gate electrodes; and each of said floating gate electrodes having a substantially parallelogram planar surface portion.

21. A cell array as claimed in claim 20, wherein each of said control gate electrodes has a substantially "less-than" symbol-shaped portion located on a corresponding one of said field insulation film portions.

22. A cell array as claimed in claim 20, wherein:

each of said control gate electrodes has a first bent portion, where two adjacent control gate electrodes are spaced apart from each other at a first distance, and a second bent portion, where said two adjacent control gate electrodes are spaced apart from each other at a second distance less than said first distance.

23. A cell array of non-volatile memory semiconductor memory devices, comprising:

a semiconductor substrate having a first conduction type;

a first insulating film comprising plural first insulation film portions spaced apart from each other, adjacent said portions having corresponding, parallel and spaced opposite edges defining therebetween element formation regions of the substrate;

a plurality of active regions formed in corresponding, said plural element formation regions of said semiconductor substrate, each of said active regions having a second conduction type opposite to said first conduction type;

a second insulating film formed on said active regions;

a plurality of floating gate electrodes formed on said first insulating film, each of said floating gate electrodes comprising a first end running in parallel with a corresponding one of the parallel and spaced, edges of adjacent said field insulation film portions, a second end running in parallel with the other of the parallel and spaced, opposite edges of said adjacent field insulation film portions, said second end being opposite to said first end, and a third end running obliquely with respect to said corresponding one of the parallel and spaced, opposite edges of said field insulating film, said fourth end running parallel to said third end.

* * * * *

UNITED STATES PATENT AND TRADEMARK OFFICE
CERTIFICATE OF CORRECTION

PATENT NO. : 5,148,246
DATED : September 15, 1992
INVENTOR(S) : EMA

It is certified that error appears in the above-indentified patent and that said Letters Patent is hereby corrected as shown below:

On the title page: Item[54] and Column 1, line 1,

Title: Delete "A".

[57] Abstract:
line 1, after "of" insert --plural--;
line 2, change "device" to --devices--;
line 15, change "adjacent four of" to --four adjacent--;
line 16, delete "the".

Col. 1, line 1, delete "A".

Col. 3, line 63, after "lie" insert --on the--.

* Col. 5, line 41, change "agnstroms" to --angstroms--.

Col. 6, line 21, change "symbol," to -- symbol- --.

Col. 9, line 44, change "form" to --from--.

Signed and Sealed this

Twenty-fourth Day of May, 1994

Attest:

BRUCE LEHMAN

*Attesting Officer*          Commissioner of Patents and Trademarks